United States Patent
Sunaba et al.

(10) Patent No.: US 7,138,751 B2
(45) Date of Patent: Nov. 21, 2006

(54) CRYSTAL UNIT

(75) Inventors: Susumu Sunaba, Saitama (JP); Hiroaki Yagishita, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 197 days.

(21) Appl. No.: 10/991,692

(22) Filed: Nov. 18, 2004

(65) Prior Publication Data
US 2005/0104481 A1    May 19, 2005

(30) Foreign Application Priority Data
Nov. 19, 2003  (JP)  ............... 2003-389720
Nov. 4, 2004   (JP)  ............... 2004-320347

(51) Int. Cl.
*H01L 41/08* (2006.01)
(52) U.S. Cl. ............................................. 310/344
(58) Field of Classification Search ............. 310/340, 310/344, 348
See application file for complete search history.

(56) References Cited

U.S. PATENT DOCUMENTS 4,405,875 A * 9/1983 Nagai ....................... 310/344
5,521,438 A * 5/1996 Okamoto et al. ........... 257/703
6,833,654 B1* 12/2004 Rubach ...................... 310/344

FOREIGN PATENT DOCUMENTS

| JP | 2000-164746 | 6/2000 |
| JP | 2000-236035 | 8/2000 |
| JP | 2003-158211 | 5/2003 |

* cited by examiner

*Primary Examiner*—Mark Budd
(74) *Attorney, Agent, or Firm*—Knobbe Martens Olson & Bear, LLP

(57) ABSTRACT

A quartz crystal unit includes a casing body having a cavity defined therein and having an opening, a quartz crystal blank disposed in the cavity, and a metal cover closing the opening of the cavity and hermetically sealing the crystal blank in the cavity. The metal cover has a core made of Kovar, a barrier metal layer disposed on one principal surface of the core, and a brazing layer disposed on the barrier metal layer. The barrier metal layer is made of an alloy which is composed mainly of copper and which has a thermal expansion coefficient that is smaller than a thermal expansion coefficient of cupper. The metal cover is joined to a peripheral edge portion of the opening by the brazing layer. The barrier metal layer is preferably made of a copper-nickel alloy, and the brazing layer is preferably made of silver brazing material.

11 Claims, 1 Drawing Sheet

3A (Kv)
6 (Ni)
7 (Ag)

3A (Kv)
6A (CuNi)
7 (Ag)

CRYSTAL UNIT

BACKGROUND OF THE INVENTION

1. Field of the Invention

The present invention relates to a quartz crystal unit, and more particularly to a crystal unit having a quartz crystal blank hermetically sealed in a casing by joining a metal cover to a casing body with a metal brazing material by, for example, seam welding.

2. Description of the Related Art

Crystal units having at least a crystal blank hermetically sealed in a casing are used as a reference source of frequency or time in oscillators for various electronic devices. The casings of the crystal units are required to have a high sealing capability for keeping the oscillation frequency stable, and needs to have a reliable hermetical sealing structure.

FIG. 1A is a cross-sectional view of the structure of a conventional crystal unit, and FIG. 1B is an enlarged fragmentary cross-sectional view of a metal cover used in the conventional crystal unit.

The conventional crystal unit has crystal blank 2 housed in a cavity defined in casing body 1 and metal cover 3 placed over the opening of the cavity to hermetically seal crystal blank 2 in the cavity. Casing body 1 is made of laminated ceramics, and has external terminals (not shown) disposed on outer surfaces (bottom and side surfaces) thereof for mounting the crystal unit on a mounting board and electrically connecting the crystal unit to an external circuit. Joint member 4 for seam welding is disposed on the peripheral edge portion of the opening of the cavity in casing body 1. Joint member 4 is in the form of a metal ring of Kovar having its surface plated with gold (Au). Alternatively, joint member 4 is in the form of a thick metal layer comprising a metalized layer of tungsten (W) or the like directly disposed on the surface of the peripheral edge portion of the opening of the cavity in casing body 1 and a gold layer plated on the metalized layer, for directly welding metal cover 3 to casing body 1 which is made of laminated ceramics.

Crystal blank 2 comprises an AT-cut quartz crystal blank, for example, in the shape of a substantially rectangular plate, and has excitation electrodes (not shown) on both principal surfaces thereof. Extension electrodes are drawn from each of the excitation electrodes toward respective opposite ends of one side portion of the crystal blank. A pair of crystal terminals is disposed on the bottom of the cavity in casing body 1. The extension electrodes are secured to the crystal terminals by an electrically conductive adhesive, holding crystal blank 2 horizontally in the cavity. The crystal terminals are electrically connected to the external terminals by conductive paths formed through casing body 1.

Metal cover 3 includes core (i.e., base) 3A made of Kovar (Kv) which is a tertiary alloy of iron (Fe), nickel and cobalt (Co). Nickel layers functioning as barrier metal layers 6 are formed on both surfaces of metal cover 3 by cladding, for example. Kovar is used as core 3A of metal cover 3 because its thermal expansion coefficient is substantially equal to that of the laminated ceramics of casing body 1. Silver brazing layer 7, which is metal brazing material, is disposed on one of the principal surfaces of metal cover 3. Specifically, silver brazing layer 7 is disposed on barrier metal layer 6. Such a metal cover is joined to casing body 1 by seam welding, hermetically sealing crystal blank 2 in the cavity. Upon the seam welding, Joule's heat is generated in metal cover 3, especially in the core (Kovar) to melt the silver brazing layer, and then metal cover 3 is joined to casing body 1.

Kovar is corrosive because it is an alloy composed chiefly of iron, but is prevented from corroding by the nickel layer as barrier metal layer 6. Even if Kovar core 3A is corroded, the corrosion is stopped by the nickel layer, thereby reliably keeping crystal blank 2 hermetically sealed in the cavity.

A metal cover having a Kovar core used to seal an electronic component, and also an nickel layer and a brazing layer having a relatively low melting point, disposed on the Kovar core, is disclosed in Japanese laid-open patent publication No. 2000-164767 (JP, P2000-164767A). A casing body having a nickel layer, and a metal cover comprising a Kovar core and a nickel layer and a silver brazing layer which are disposed on the Kovar core, for use with a piezoelectric oscillation device such as a crystal unit, are disclosed in Japanese laid-open patent publication No. 2000-236035 (JP, P2000-236035A).

If a nickel layer is used as a barrier metal layer, then since nickel has a large electric resistivity, it is necessary to establish high voltage and large current conditions for seam-welding the metal cover to the casing body. Since such high voltage and large current conditions are liable to cause spark discharges, a rotational roller used in the seam welding process may be damaged, and the rotational roller or the like may be degraded early. Another problem is that an allowable range of current values is reduced, making it difficult to establish sealing conditions. Furthermore, inasmuch as the unit price of nickel is high, using nickel as the barrier metal results in an increase in the cost of the crystal unit.

If a nickel layer as barrier metal layer 6 is not provided, current will pass through gold layer, which is formed on the metallic ring or tungsten layer and has electric resistivity smaller than that of metal cover 3 (Kovar), upon application of voltage between a pair of the rotational roller used in the seam welding process, and then the current will generate Joule's heat to melt the silver brazing layer. However, the nickel layer as the barrier metal layer increases resistivity and limits the current in the seam welding process.

For absorbing thermal strains produced during the seam welding process, Japanese laid-open patent publication No. 2003-158211 (JP, P2003-153211A) discloses using a copper layer having a thickness in the range from 10 µm to 50 µm, preferably from 20 µm to 40 µm, instead of the nickel layer in the above arrangements, for stress relaxation. In this case, since copper has a relatively large thermal expansion coefficient, it is difficult to control the heating temperature for the copper layer and establish sealing conditions. When a copper layer is arranged between Kovar layer which is a core of metal cover 3 and the silver brazing layer, the silver brazing layer is heated via the copper layer and melts. Since copper is soft and has a large thermal expansion coefficient, expansion-shrinkage difference between the copper layer and the core or the casing body is generated between before and after the seam welding and impresses stress to the casing body. The strict control of heating temperature is necessary to prevent the casing body from being applied with the stress, and the establishment of sealing conditions becomes difficult.

For example, if current in a seam welding process is too large, the copper layer will lost its shape by the over-generated heat to run over to the outer side surface of the casing body. As a result, stress is generated in casing body by the expansion and shrinkage accompanied with temperature changes from the normal temperature to the heated condition and vice versa. The stress generated in casing body 1 may cause generation of cracks in casing body 1 and change in oscillation frequency due to change in holding conditions of the crystal blank by the conductive adhesive.

On the other hand, if the current in the seam welding process is too small, the silver brazing material does not sufficiently melt and the reliable hermetical sealing of the crystal unit may be deteriorated.

In any cases that a cupper layer is formed on a Kovar core, the establishment of sealing conditions of the metal cover becomes difficult due to the relatively large thermal expansion coefficient of copper.

SUMMARY OF THE INVENTION

It is an object of the present invention to provide a crystal unit which can be seam-welded with a low current, allows sealing conditions to be established with ease, and is highly stable.

Another object of the present invention is to provide a crystal unit which can be manufactured at a lower cost.

According to an aspect of the present invention, there is provided a crystal unit comprising a casing body having a cavity defined therein and having an opening, a crystal blank disposed in the cavity, and a metal cover closing the opening of the cavity and hermetically sealing the crystal blank in the cavity, the metal cover having a core made of Kovar, a barrier metal layer disposed on one principal surface of the core, and a brazing layer disposed on the barrier metal layer, the metal cover being joined to the casing body with the brazing layer, and the barrier metal layer being made of an alloy which is composed mainly of copper and which has a thermal expansion coefficient that is smaller than a thermal expansion coefficient of cupper.

In the present invention, the brazing layer is preferably made of a silver brazing material. The metal cover is preferably joined to the casing body by seam welding. The barrier metal layer is preferably made of an alloy of copper and nickel. The thickness of the barrier metal layer is preferably ranging from 2 μm to 9 μm.

In the present invention, the casing body in which the crystal blank is sealed may also house an integrated circuit (IC) chip which cooperates with the crystal blank in making up an oscillation circuit. With the crystal blank and the IC chip sealed in the casing body, the assembly delivers a stable oscillation signal simply by being supplied with a power supply voltage from outside. The assembly which incorporates the crystal blank and the IC circuit chip sealed in the casing body is also included in the category of the crystal unit according to the present invention.

According to the present invention, since an alloy having a thermal expansion coefficient smaller than that of copper is used as the barrier metal layer, the expansion-shrinkage difference between before and after the seam welding process can be decreased and the stress generated in the casing body can be reduced. Therefore, the present invention makes it easy to control the heating temperature upon the seam welding process and the establishment of sealing conditions.

DETAILED DESCRIPTION OF THE PREFERRED EMBODIMENT

Figure 1A:
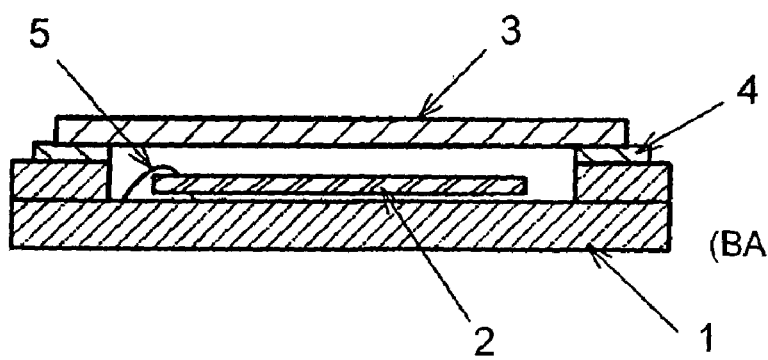
FIG. 1A is a cross-sectional view of a conventional crystal unit.
Figure 1B:
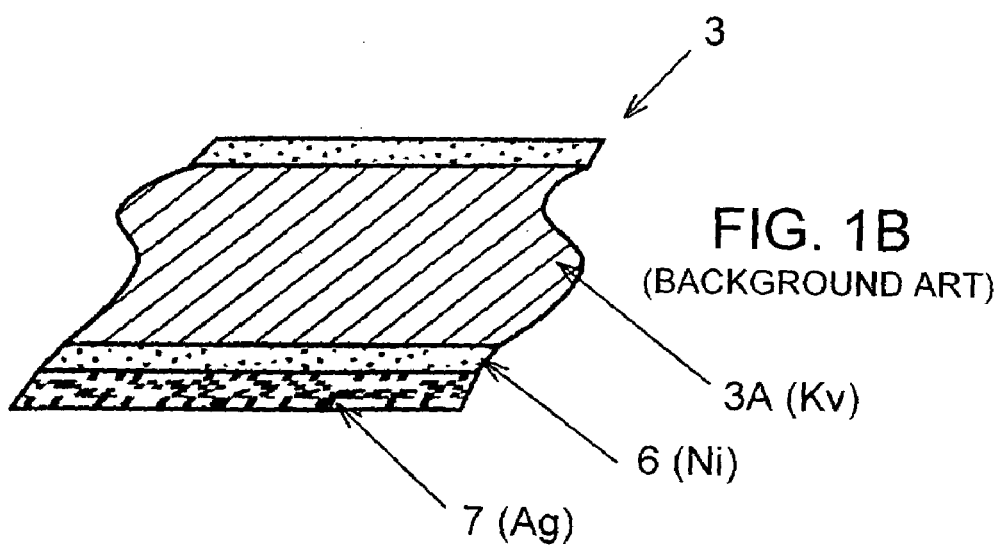
FIG. 1B is an enlarged fragmentary cross-sectional view of a metal cover used in the conventional crystal unit.
Figure 2:
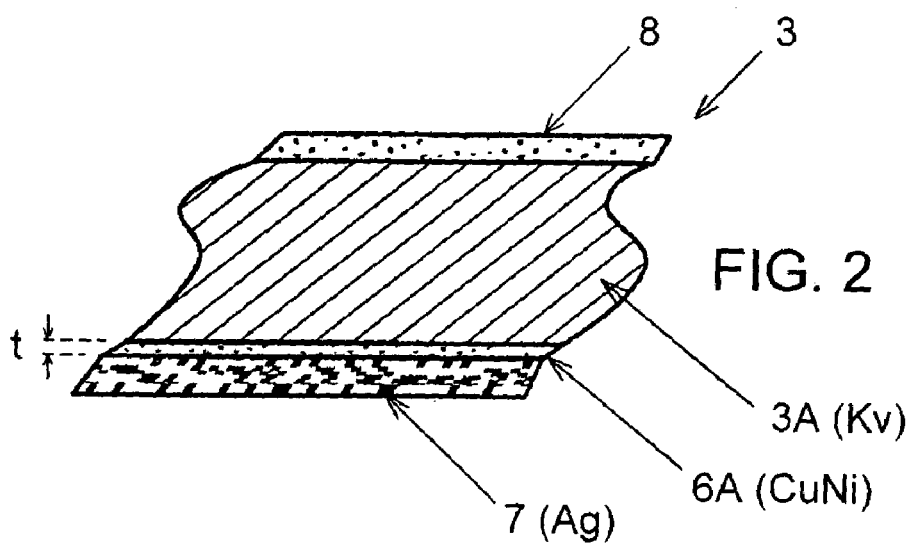
FIG. 2 is an enlarged fragmentary cross-sectional view of a metal cover used in a crystal unit according to an embodiment of the present invention.

A crystal unit according to an embodiment of the present invention is of the same structure as the conventional crystal unit shown in FIG. 1A, except for structural details of metal cover 3. FIG. 2 illustrated the metal cover used in the crystal unit according to the present embodiment.

The crystal unit according to the present embodiment has crystal blank 2 housed in a cavity defined in casing body 1 made of laminated ceramics and metal cover 3 placed over the opening of the cavity and seam-welded to casing cavity 1 to hermetically seal crystal blank 2 in the cavity. Casing body 1 has external terminals (not shown) disposed on outer surfaces thereof. Joint member 4 for seam welding is disposed on the peripheral edge portion of the opening of the cavity in casing body 1. Joint member 4 is in the form of a metal ring or a thick metal layer on which a gold layer is arranged, as with the conventional crystal unit. Crystal blank 2 comprises an AT-cut quartz crystal blank, for example, as with the conventional one. Crystal blank 2 is fixed to a pair of crystal terminals disposed on the bottom of the cavity in casing body 1 by an electrically conductive adhesive, and is held horizontally in the cavity. After crystal blank 2 is fixed to the bottom of the cavity in casing body 1 by the electrically conductive adhesive, metal cover 3 is seam-welded to casing body 1.

Metal cover 3 includes core 3A made of Kovar. Core 3A of Kovar has a thickness in the range from 80 μm to 1 mm, for example. Barrier metal layer 6A is formed on one principal surface of core 3A by plating, cladding sputtering or the like. Brazing layer 7 is disposed on barrier metal layer 6A. Brazing layer 7 generally comprises a silver brazing layer having a thickness ranging from 10 μm to 200 μm, for example. Protective layer 8 made of nickel for protecting Kovar core 3 from corrosion is formed on the other principal surface of core 3A by cladding or the like. The manufacturer's name, oscillation frequency and the like is indicated on the surface of protective layer 8 by laser marking, for example. When a nickel layer is used as protective layer 8, since no striped pattern is formed on the surface of the protective layer due to oxidization, the marked letters can be clearly recognized after elapse of a long time period.

According to the present embodiment, barrier metal layer 6A is made of an alloy which is composed mainly of copper and has a thermal expansion coefficient that is smaller than a thermal expansion coefficient of copper. The thickness t of barrier metal layer 6A is in the range of 2 μm≦t≦9 μm, for example, and has a thickness of 3 μm, for example, in practice. The alloy composed mainly of copper refers to an alloy wherein copper has a weight ratio of 50% or higher. Such barrier metal layer 6A may be a copper-nickel alloy. Since nickel has a thermal expansion coefficient smaller than that of copper, a copper-nickel alloy also has a thermal expansion coefficient smaller than that of copper. The copper-nickel alloy used as barrier metal layer 8A may be made of 70 weight % of copper and 30 weight % of nickel, for example. The copper-nickel alloy of such a composition is a general-purpose alloy and easily available. It is known that the copper-nickel alloy of such a composition has been used as pipes in seawater and is highly resistant to corrosion. Therefore, an alloy having a composition of 70 weight % of copper and 30 weight % of nickel is a preferable material as the barrier metal layer in the present invention. Since a copper-nickel alloy material is generally cheaper than simple substance of nickel, the cost reduction can be achieved by usage of the copper-nickel alloy.

If barrier metal layer 6A is made of a copper alloy, then since this material has a low electric resistivity, mainly Kovar core 3A generates heat in the seam welding process, and the heat is transferred through barrier metal layer 6A to brazing layer 7, which is molten to join joint member 4 on casing body 1. Since the electric current is supplied through rotational rollers, conditions are established to keep molten only the portion of the brazing layer 7 which is sandwiched by the rotational rollers. If barrier metal layer 6A is too thick, then the heat generated by Kovar core 3A is dissipated by barrier metal layer 6A, failing to effectively heat the portion of the brazing layer 7 which is sandwiched by the rotational rollers or heating brazing layer 7 in a wide range to cause brazing layer 7 to flow out. Accordingly, it becomes difficult to establish sealing conditions. From this view point, barrier metal layer 6A has preferably a thickness of equal to or smaller then 9 μm. If barrier metal layer 6A is too thin, i.e., has a thickness of less than 2 μm, then it fails to be effective enough to prevent Kovar core 3A from being corroded.

In the crystal unit according to the present invention, with metal cover 3 being thus constructed, barrier metal layer 6A and protective layer 8 prevent Kovar core 3A from being corroded. Even if Kovar core 3A is corroded, barrier metal layer 6A stops the corrosion. Consequently, crystal blank 2 is reliably hermetically sealed. Since barrier metal layer 6A is made of an alloy composed mainly of copper, its electric resistivity is smaller than if the barrier metal layer were made of nickel. Therefore, metal cover 3 can be seam-welded with a lower drive current, and the rotational roller is prevented from suffering damage and early degradation.

Since the copper-nickel alloy has a small thermal expansion coefficient and is harder than copper, the expansion-detraction difference between before and after the seam welding is reduced and the stress impressed to casing body 1 is reduced. Therefore, the usage of the copper-nickel alloy prevents the generation of cracks in the casing body, maintains hermetical sealing of the casing body, and reduces the affection to the holding system of the crystal blank to prevent frequency change.

Barrier metal layer 6A has good thermal conductivity while maintaining a small heat capacity in the present embodiment. As a result, Joule's heat generated in the core (Kovar) of metal cover 3 upon the seam welding process is directly transferred to the silver brazing material thereby relaxing sealing conditions. The silver brazing material is prevented from flowing out and the barrier metal layer (copper-nickel alloy) is prevented from losing its shape.

While the preferred embodiment of the present invention has been described above, the copper-nickel alloy for use as the barrier metal layer is not limited to the alloy containing 70 weight % of copper and 30 weight % of nickel. For better electric conductivity, it is desirable for the alloy to contain 50 weight % or more of copper. The alloy composed mainly of copper, for use as the barrier metal layer, is not limited to the copper-nickel alloy, but may be another copper-base alloy which has a smaller thermal expansion coefficient than copper and is harder than copper. Metal cover 3 is not necessarily joined to casing body 1 by the seam welding process, but may be joined to casing body 1 by another joining process, for example, an electron beam welding process which applies an electron beam to melt brazing layer 7.

Brazing layer 7 used in the seam welding process or electron beam welding process may be made of another brazing material such as a nickel brazing material, for example, or alternatively an eutectic alloy rather than the silver brazing material described above.

The other metal such as gold, or copper alloy can be used for protective layer 8 inasmuch as the metal has a function of preventing Kovar, which is the core of metal cover 3, from being corroded. In this case, if both barrier metal layer 6A and protective layer 8 are formed with the copper-nickel alloy, the manufacturing cost of crystal units is further reduced.

Although only crystal blank 2 is hermetically sealed in casing body 1 in the above description, the present invention can be also applied to a case in which a crystal blank and an IC chip which is electrically connected to the crystal blank are houses in the casing. Furthermore, the present invention can be also applied to metal cover which seals a piezoelectric element other than the crystal blank in a casing by seam welding or the like.

What is claimed is:

1. A crystal unit comprising:
   a casing body having a cavity defined therein and having an opening;
   a crystal blank disposed in said cavity; and
   a metal cover closing said opening of said cavity and hermetically sealing said crystal blank in said cavity;
   wherein said metal cover has a core made of Kovar, a barrier metal layer disposed on one principal surface of said core, and a brazing layer disposed on said barrier metal layer, said metal cover being joined to the casing body with said brazing layer; and
   said barrier metal layer is made of an alloy which is composed mainly of copper and which has a thermal expansion coefficient that is smaller than a thermal expansion coefficient of copper.

2. The crystal unit according to claim 1, wherein said brazing layer is made of a silver brazing material.

3. The crystal unit according to claim 2, wherein said metal cover is joined to said casing body by seam welding.

4. The crystal unit according to claim 3, wherein said casing body has a joint member for seam welding which is disposed on a peripheral edge portion of said opening.

5. The crystal unit according to claim 1, wherein said barrier metal layer is made of an alloy of copper and nickel.

6. The crystal unit according to claim 1, wherein said alloy of copper and nickel contains 70 weight % of copper and 30 weight % of nickel.

7. The crystal unit according to claim 1, wherein said casing body is made of laminated ceramics.

8. The crystal unit according to claim 1, wherein said metal cover has a protective layer disposed on another principal surface of said core.

9. The crystal unit according to claim 1, wherein said barrier metal layer has a thickness ranging from 2 μm to 9 μm.

10. The crystal unit according to claim 9, wherein said barrier metal layer has a thickness of 3 μm.

11. A piezoelectric oscillation unit comprising:
    a casing body having a cavity defined therein and having an opening;
    a piezoelectric blank disposed in said cavity; and
    a metal cover closing said opening of said cavity and hermetically sealing said piezoelectric blank in said cavity;
    wherein said metal cover has a core made of Kovar, a barrier metal layer disposed on one principal surface of said core, and a brazing layer disposed on said barrier metal layer, said metal cover being joined to the casing body with said brazing layer; and
    said barrier metal layer is made of an alloy which is composed mainly of copper and which has a thermal expansion coefficient that is smaller than a thermal expansion coefficient of copper.

* * * * *